United States Patent
Beyer et al.

(10) Patent No.: US 7,629,211 B2
(45) Date of Patent: Dec. 8, 2009

(54) FIELD EFFECT TRANSISTOR AND METHOD OF FORMING A FIELD EFFECT TRANSISTOR

(75) Inventors: Sven Beyer, Dresden (DE); Thorsten Kammler, Ottendorf-Okrilla (DE); Rolf Stephan, Dresden (DE); Manfred Horstmann, Duehrrroersdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 101 days.

(21) Appl. No.: 11/684,211

(22) Filed: Mar. 9, 2007

(65) Prior Publication Data
US 2008/0026531 A1 Jan. 31, 2008

(30) Foreign Application Priority Data
Jul. 31, 2006 (DE) .................. 10 2006 035 665

(51) Int. Cl.
*H01L 21/331* (2006.01)
*H01L 21/8234* (2006.01)
(52) U.S. Cl. .................. 438/199; 438/206; 438/214; 438/350; 438/357; 438/360; 257/E21.419; 257/E21.428
(58) Field of Classification Search .......... 257/E21.419, 257/E21.428
See application file for complete search history.

(56) References Cited

U.S. PATENT DOCUMENTS

| 7,545,006 B2 * | 6/2009 | Chen et al. .................. 257/382 |
| 2005/0093075 A1 * | 5/2005 | Bentum et al. .............. 257/368 |
| 2005/0184345 A1 | 8/2005 | Lin et al. ..................... 257/375 |
| 2006/0292776 A1 * | 12/2006 | Jin et al. ..................... 438/197 |

FOREIGN PATENT DOCUMENTS

| WO | WO 2006/011939 A2 | 2/2006 |
| WO | WO 2006/066194 A2 | 6/2006 |

* cited by examiner

*Primary Examiner*—Charles D Garber
*Assistant Examiner*—Mohsen Ahmadi
(74) *Attorney, Agent, or Firm*—Williams, Morgan & Amerson, P.C.

(57) ABSTRACT

A method of forming a field effect transistor comprises providing a semiconductor substrate, a gate electrode being formed over the semiconductor substrate. At least one cavity is formed adjacent the gate electrode. A strain-creating element is formed in the at least one cavity. The strain-creating element comprises a compound material comprising a first chemical element and a second chemical element. A first concentration ratio between a concentration of the first chemical element in a first portion of the strain-creating element and a concentration of the second chemical element in the first portion of the strain-creating element is different from a second concentration ratio between a concentration of the first chemical element in a second portion of the strain-creating element and a concentration of the second chemical element in the second strain-creating element.

7 Claims, 6 Drawing Sheets

FIELD EFFECT TRANSISTOR AND METHOD OF FORMING A FIELD EFFECT TRANSISTOR

BACKGROUND OF THE INVENTION

1. Field of the Invention

The subject matter disclosed herein generally relates to the formation of integrated circuits, and, more particularly, to the formation of field effect transistors comprising at least one strain-creating element formed adjacent a gate electrode thereof.

2. Description of the Related Art

Integrated circuits comprise a large number of individual circuit elements, such as transistors, capacitors and resistors. These elements are connected internally to form complex circuits such as memory devices, logic devices and microprocessors. The performance of integrated circuits can be improved by increasing the number of functional elements in the circuit in order to increase their functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Field effect transistors are used as switching elements in integrated circuits. They provide a means to control a current flowing through a channel region located between a source region and a drain region. The source region and the drain region are highly doped. In N-type transistors, the source and drain regions are doped with an N-type dopant. Conversely, in P-type transistors, the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

When reducing the size of field effect transistors, it is important to maintain a high conductivity of the channel region in the "on" state. The conductivity of the channel region in the "on" state depends on the dopant concentration in the channel region, the mobility of the charge carriers, the extension of the channel region in the width direction of the transistor and the distance between the source region and the drain region, which is commonly denoted as "channel length." While a reduction of the width of the channel region leads to a decrease of the channel conductivity, a reduction of the channel length enhances the channel conductivity. An increase of the charge carrier mobility leads to an increase of the channel conductivity.

As feature sizes are reduced, the extension of the channel region in the width direction is also reduced. A reduction of the channel length entails a plurality of issues associated therewith. First, advanced techniques of photolithography and etching have to be provided in order to reliably and reproducibly create transistors having short channel lengths. Moreover, highly sophisticated dopant profiles, in the vertical direction as well as in the lateral direction, are required in the source region and in the drain region in order to provide a low sheet resistivity and a low contact resistivity in combination with a desired channel controllability.

In view of the problems associated with a further reduction of the channel length, it has been proposed to also enhance the performance of field effect transistors by increasing the charge carrier mobility in the channel region. In principle, at least two approaches may be used to increase the charge carrier mobility.

First, the dopant concentration in the channel region may be reduced. Thus, the probability of scattering events of charge carriers in the channel region is reduced, which leads to an increase of the conductivity of the channel region. Reducing the dopant concentration in the channel region, however, significantly affects the threshold voltage of the transistor device. This makes the reduction of dopant concentration a less attractive approach.

Second, the lattice structure in the channel region may be modified by creating tensile or compressive strain. This leads to a modified mobility of electrons and holes, respectively. Depending on the magnitude of the strain, a compressive strain may significantly increase the mobility of holes in a silicon layer, and may also increase the electron mobility. The mobility of electrons may also be increased by providing a silicon layer having a tensile strain.

A method of forming a field effect transistor wherein the channel region is formed in strained silicon will be described in the following with reference to FIGS. 1a-1d. FIG. 1a shows a schematic cross-sectional view of a semiconductor structure 100 in a first stage of a manufacturing process according to the state of the art. The semiconductor structure 100 comprises a substrate 101. An active region 104 is provided in the substrate 101. A trench isolation structure 102 separates the active region 104 from other elements of the semiconductor structure 100 which are not shown in FIG. 1a. A gate electrode 106, which is separated from the substrate 101 by a gate insulation layer 105, is formed over the substrate 101. The gate electrode 106 is covered by a cap layer 107 and flanked by first sidewall spacers 108, 109. The active region 104, the trench isolation structure 102, the gate electrode 106, the gate insulation layer 105, as well as the first sidewall spacers 108, 109 and the cap layer 107, together form portions of a field effect transistor element 130.

In the formation of the semiconductor structure 100, the substrate 101 is provided and the trench isolation structure 102 is formed by means of methods of photolithography, deposition and/or oxidation techniques known to persons skilled in the art. Then, ions of a dopant material are implanted into the substrate 101 in order to form the active region 104. The type of dopants corresponds to the doping of the channel region of the field effect transistor to be formed. Hence, in the formation of an N-type transistor, ions of a P-type dopant are implanted, whereas ions of an N-type dopant are implanted in the formation of a P-type transistor.

After the formation of the active region 104, an oxidation process is performed to form the gate insulation layer 105. Thereafter, the gate electrode 106 and the cap layer 107 are formed by deposition and photolithography processes known to persons skilled in the art. Subsequently, the first sidewall spacers 108, 109 are formed by depositing a layer of a spacer material and performing an anisotropic etch process, wherein portions of the layer of spacer material over substantially horizontal portions of the semiconductor structure 100 are removed, whereas portions of the layer of spacer material provided on the sidewalls of the gate electrode 106 remain on the substrate 101 and form the first sidewall spacers 108, 109.

A schematic cross-sectional view of the semiconductor structure 100 in a later stage of the manufacturing process according to the state of the art is shown in FIG. 1b. An etch process is performed. The etch process can be an isotropic etch process adapted to selectively remove the material of the substrate 101, leaving the material of the cap layer 107 and the first sidewall spacers 108, 109 substantially intact, for example, a known dry etch process. The cap layer 107 and the first sidewall spacers 108, 109 protect the gate electrode 106, the gate insulation layer 105 and a channel region 140 below the gate electrode 106 from being affected by an etchant used in the etch process.

Portions of the substrate 101 adjacent the gate electrode 106, however, are etched away. Thus, a source side cavity 110 and a drain side cavity 111 are formed adjacent the gate electrode 106. Due to the isotropy of the etch process, portions of the substrate 101 below the first sidewall spacers 108, 109 and, optionally, the gate electrode 106 are removed. Therefore, the cavities 110, 111 may extend below the sidewall spacers 108, 109 and/or the gate electrode 106, the bottom surface 150, 151 of the cavities 110, 111 having a somewhat rounded shape.

After the etch process, the cavities 110, 111 may have a rough surface. If a strain-creating material were deposited over the substrate 101 in order to fill the cavities 110, 111 as described below, unevenness on the bottom surface 150, 151 of the cavities 110, 111 would act as nucleation sites, leading to an undesirable polycrystalline growth of the strain-creating material. Therefore, a process is performed to reduce the roughness of the bottom surface of the cavities.

The roughness reducing process can be a high temperature prebake process wherein the semiconductor structure 100 is exposed to a temperature in a range from about 800-1000° C. for about 30 seconds to about 10 minutes. During the prebake process, the semiconductor structure 100 can be provided in an ambient comprising hydrogen gas which substantially does not react chemically with the materials of the semiconductor structure 100. The high temperature prebake process leads to a diffusion of atoms on the surface of the cavities 110, 111. Due to the diffusion, a material transport may occur which leads to a reduction in the roughness of the surface of the cavities 110, 111.

FIG. 1c shows a schematic cross-sectional view of the semiconductor structure 100 in yet another stage of the manufacturing process. Strain-creating elements 114, 115 are formed adjacent the gate electrode 106. To this end, the cavities 110, 111 are filled with a layer of a strain-creating material. In methods of forming a field effect transistor according to the state of the art, the strain-creating material may comprise silicon germanide. As persons skilled in the art know, silicon germanide is an alloy of silicon (Si) and germanium (Ge). Other materials may be employed as well.

Silicon germanide is a semiconductor material having a greater lattice constant than silicon. When silicon germanide is deposited in the cavities 110, 111, however, the silicon and germanium atoms in the strain-creating elements 114, 115 tend to adapt to the lattice constant of the silicon in the substrate 101. Therefore, the lattice constant of the silicon germanide in the strain-creating elements 114, 115 is smaller than the lattice constant of a bulk silicon germanide crystal. Thus, the material of the strain-creating elements 114, 115 is compressively strained.

The strain-creating elements 114, 115 can be formed by means of selective epitaxial growth. As persons skilled in the art know, selective epitaxial growth is a variant of plasma enhanced chemical vapor deposition wherein parameters of the deposition process are adapted such that material is deposited only on the surface of the substrate 101 in the cavities 110, 111, whereas substantially no material deposition occurs on the surface of the first sidewall spacers 108, 109 and the cap layer 107.

Since the strain-creating elements 114, 115 are compressively strained, they exhibit a force to portions of the substrate 101 in the vicinity of the gate electrode 106, in particular to portions of the substrate 101 in the channel region 140. Therefore, a compressive strain is created in the channel region 140.

FIG. 1d shows a schematic cross-sectional view of the semiconductor structure 100 in yet another stage of the manufacturing process according to the state of the art. After the formation of the strain-creating elements 114, 115, the first sidewall spacers 108, 109 are removed. Additionally, the cap layer 107 may be removed. Thereafter, an extended source region 116 and an extended drain region 117 are formed in portions of the substrate 101 and the strain-creating elements 114, 115 by means of an ion implantation process known to persons skilled in the art. In the ion implantation process, ions of a dopant material are introduced into the substrate 101 and the strain-creating elements 114, 115. In case of the formation of an N-type field effect transistor, ions of an N-type dopant are introduced, wherein ions of a P-type dopant are provided in the formation of a P-type transistor.

Subsequently, second sidewall spacers 118, 119 are formed adjacent the gate electrode 106. Thereafter, a further ion implantation process is performed to form a source region 120 and a drain region 121 by introducing dopant material ions.

Finally, an annealing process may be performed to activate the dopant materials introduced in the formation of the extended source region 116, the extended drain region 117, the source region 120 and the drain region 121.

One problem associated with the above method of forming a field effect transistor according to the state of the art is that a relaxation of strain may occur in the strain-creating elements 114, 115. Therefore, the strain in the strain-creating elements 114, 115 and consequently the strain in the channel region 140 can be reduced. This may lead to a reduced enhancement of the mobility of holes and/or electrons in the channel region.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment disclosed herein, a method of forming a field effect transistor comprises providing a semiconductor substrate, a gate electrode being formed above the semiconductor substrate. At least one cavity is formed in the substrate adjacent the gate electrode. A strain-creating element is formed in the at least one cavity. The strain-creating element comprises a compound material comprising a first chemical element and a second chemical element. A first concentration ratio between a concentration of the first chemical element in a first portion of the strain-creating element and a concentration of the second chemical element in the first portion of the strain-creating element is different from a second concentration ratio between a concentration of the first chemical element in a second portion of the strain-creating element and a concentration of the second chemical element in the second portion of the strain-creating element.

According to another illustrative embodiment disclosed herein, a method of forming a field effect transistor comprises providing a semiconductor substrate, a gate electrode being formed above the substrate. At least one cavity is formed in the substrate adjacent the gate electrode. A selective epitaxial growth process adapted to form a strain-creating element in the at least one cavity is performed. The strain-creating element comprises a compound material comprising a first chemical element and a second chemical element. The selective epitaxial growth process comprises supplying a first reactant comprising the first chemical element and a second reactant comprising the second chemical element. A ratio between a flow rate of the first reactant and a flow rate of the second reactant is changed at least once during the selective epitaxial growth process.

According to yet another illustrative embodiment disclosed herein, a field effect transistor comprises a substrate. A gate electrode is formed above the substrate. The substrate comprises at least one cavity located in the substrate adjacent the gate electrode. A strain-creating element is located in the at least one cavity. The strain-creating element comprises a compound material comprising a first chemical element and a second chemical element. A ratio between a concentration of the first chemical element and a concentration of the second chemical element increases in a vertical direction with increasing distance from a bottom surface of the cavity in the substrate.

BRIEF DESCRIPTION OF THE DRAWINGS

The disclosure may be understood by reference to the following description taken in conjunction with the accompanying drawings, in which like reference numerals identify like elements, and in which.

Figure 1A:
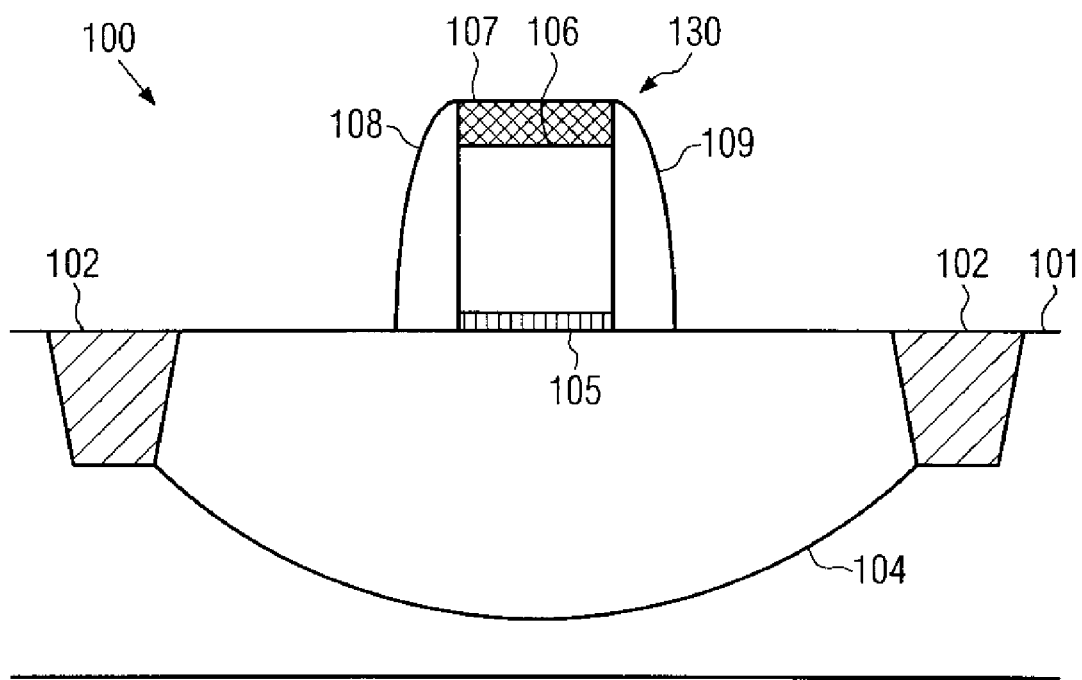
FIGS. 1a-1d show schematic cross-sectional views of a semiconductor structure in stages of a manufacturing process according to the state of the art.
Figure 1B:
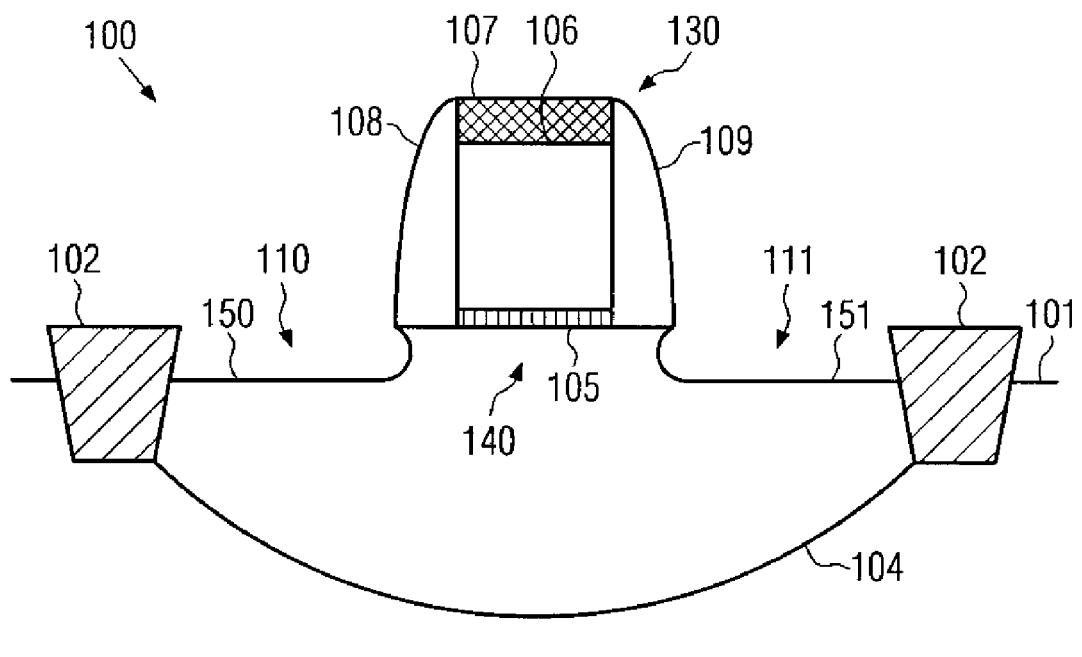
Figure 1C:
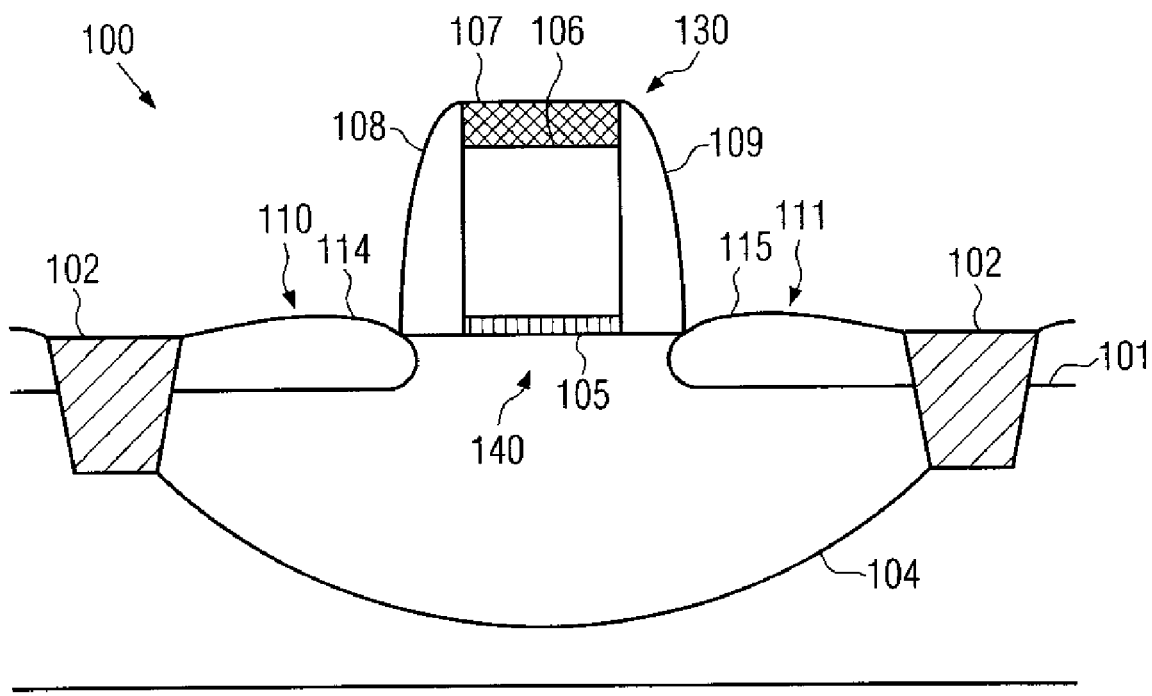
Figure 1D:
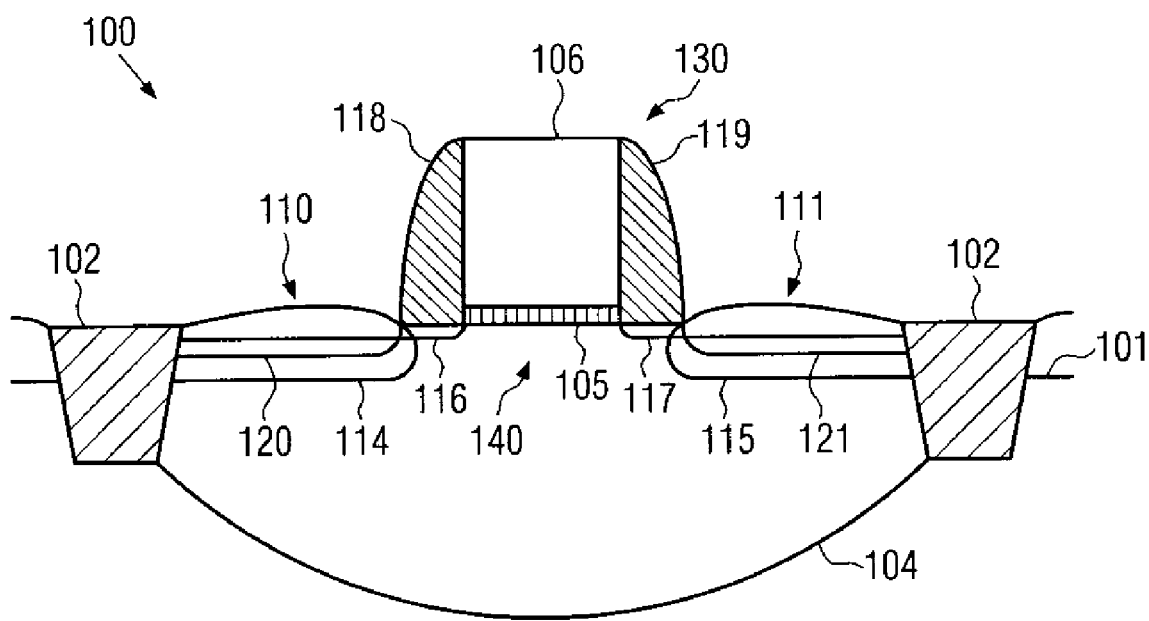

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein is generally based on the realization that the undesirable relaxation of strain observed in the strain-creating elements 114, 115 formed in the method of manufacturing a field effect transistor according to the state of the art described above with reference to FIGS. 1a-1d may be caused by a formation of crystal defects in the strain-creating elements 114, 115. Such crystal defects may be particularly formed at the interface between the semiconductor substrate 101 and the strain-creating elements 114, 115 where large gradients of the strain may occur. The presence of crystal defects allows the crystal lattice of the strain-creating material in the strain-creating elements 114, 115 to relax such that it more closely resembles the crystal lattice of an unstrained bulk crystal of the strain-creating material. Therefore, the strain in the strain-creating elements 114, 115 and, thus, the strain in the channel region 140 of the transistor element 130 may be reduced.

In the present disclosure, strain-creating elements adjacent the gate electrode of a field effect transistor may be formed with a chemical composition which varies between different portions of the strain-creating elements. In particular, a composition of portions of the strain-creating elements in the vicinity of an interface between the strain-creating elements and an underlying semiconductor substrate may more closely resemble the composition of the semiconductor substrate than a composition of portions of the strain-creating elements provided at a greater distance from the semiconductor substrate. Thus, the strain in the strain-creating elements may gradually increase from a relatively low strain in the vicinity of the substrate to a moderately high strain in portions of the strain-creating elements that are a greater distance from the substrate. Hence, the presence of high gradients of the strain can be avoided. This may allow a reduction of the likelihood of the occurrence of crystal defects. Thus, a relaxation of strain caused by crystal defects may be advantageously reduced.

Figure 2A:
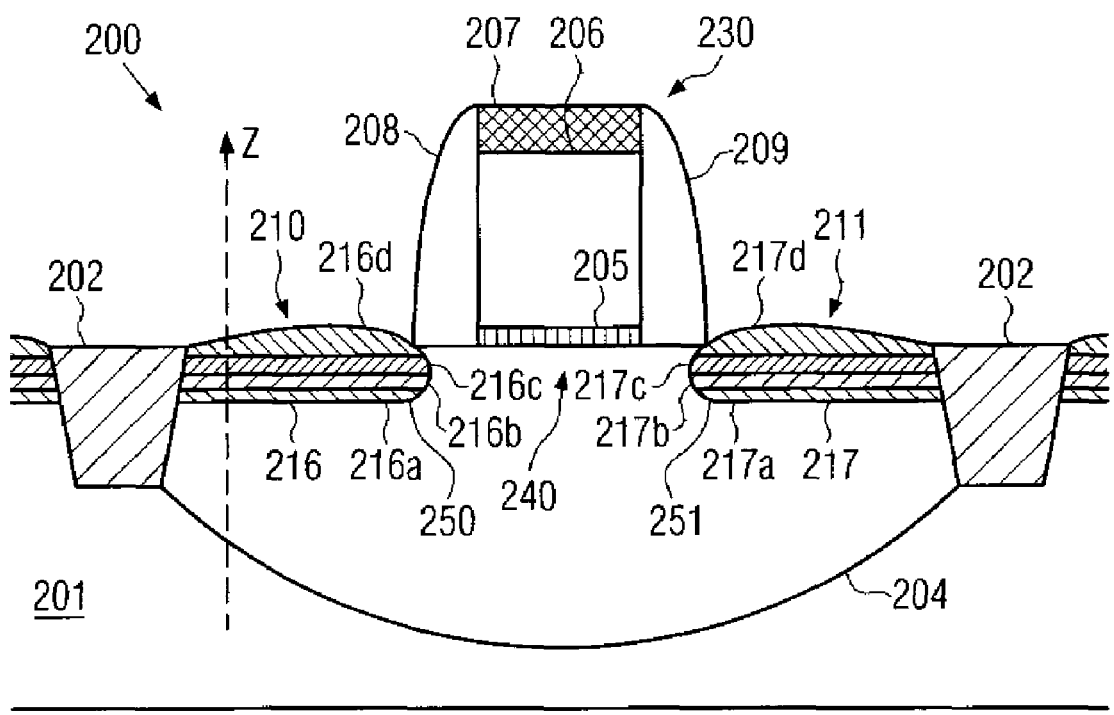
FIGS. 2a-2b show schematic cross-sectional views of a semiconductor structure in stages of a manufacturing process according to an embodiment disclosed herein.

FIG. 2a shows a schematic cross-sectional view of a semiconductor structure 200 in a first stage of a method of forming a field effect transistor. The semiconductor structure 200 comprises a substrate 201. In the substrate 201, a trench isolation structure 202 is formed. A gate insulation layer 205 electrically insulates a gate electrode 206 from an active region 204 formed in the substrate 201. The gate electrode 206 is covered by a cap layer 207 and flanked by first sidewall spacers 208, 209. The trench isolation structure 202, the active region 204, the gate insulation layer 205, the gate electrode 206, the cap layer 207 and the first sidewall spacers 208, 209 form a field effect transistor element 230 and may be formed by means of methods of photolithography, etching, deposition and oxidation well known to persons skilled in the art.

The substrate 201 and the gate electrode 206 may be comprised of silicon. For example, the substrate 201 may comprise crystalline silicon and the gate electrode 206 may comprise polysilicon. In some embodiments, the trench isolation structure 202, the cap layer 207 and the first sidewall spacers 208, 209 may be comprised of silicon nitride. In other embodiments, these features may comprise silicon dioxide. In still further embodiments, the trench isolation structure 202, the cap layer 207 and the first sidewall spaces 208, 209 can be formed from different materials. For example, the trench isolation structure can comprise silicon dioxide and the first sidewall spacers 208, 209, as well as the cap layer 207, can comprise silicon nitride.

A source side cavity 210 and a drain side cavity 211 are formed in the substrate 201 adjacent the gate electrode 206. Similar to the formation of the cavities 110, 111 in the method of manufacturing a field effect transistor according to the state of the art described above with reference to FIGS. 1a-1d, the cavities 210, 211 may be formed by means of an etch process which may be isotropic, for example a dry etch process.

In dry etching, which is also known as plasma etching, reactive ion etching or ion enhanced etching, a radio frequency glow discharge produces a chemically reactive species such as atoms, radicals, and ions from a relatively inert molecular gas. The etching gas is selected such that a generated species reacts chemically with the material to be etched, creating a volatile reaction product. The energy of ions impinging on the substrate may be controlled by varying the frequency applied in creating the glow discharge and/or applying a DC bias to the substrate. In general, the greater the energy of the ions, the greater the anisotropy of the etch process.

In the etch process, the semiconductor structure 200 is exposed to an etchant adapted to selectively remove the material of the substrate 201, leaving the gate electrode 206 covered by the first sidewall spacers 208, 209 and the cap layer 207 substantially intact. In embodiments disclosed herein wherein the substrate 201 comprises silicon and the cap layer 207 and the first sidewall spacers 208, 209 comprise silicon nitride and/or silicon dioxide, a selective removal of the material of the substrate 201 may be achieved by using a dry etch process performed by means of an etch gas comprising carbon tetrafluoride ($CF_4$) and/or oxygen ($O_2$). The isotropy of the etch process may be obtained by applying a low DC bias or no DC bias at all.

The present invention is not restricted to embodiments wherein a dry etch process is performed. In other embodiments, the cavities 210, 211 can be formed by means of a wet etch process.

Due to the isotropic nature of the etch process, portions of the cavities 210, 211 may extend below the first sidewall spacers 208, 209 or even below the gate electrode 206. After the etch process, the surface of the substrate 201 in the cavities 210, 211 may be rough. Similar to the method of forming a field effect transistor according to the state of the art described above with reference to FIGS. 1a-1d, the roughness of the surface of the substrate 201 in the cavities 210, 211 can be reduced, for example by performing a prebake process wherein the semiconductor structure 200 is exposed to an elevated temperature in a range from about 800-1000° C. for about 30 seconds to about 10 minutes in a hydrogen ambient. In other embodiments, the reduction of the roughness of the surface of the substrate 201 in the cavities 210, 211 can be performed by means of other methods or may even be omitted.

Strain-creating elements 216, 217 are formed adjacent the gate electrode 206. The strain-creating elements 216, 217 comprise a compound material comprising a first chemical element and a second chemical element. In embodiments disclosed herein wherein the substrate 201 comprises silicon, the second chemical element may be silicon. In some embodiments, the first chemical element may comprise germanium. In other embodiments, the first chemical element may comprise carbon. In further embodiments, other materials may be employed as well.

Silicon germanide has a greater lattice constant than that of the silicon in the substrate 201. Therefore, in embodiments wherein the strain-creating elements comprise silicon germanide, the strain-creating elements 216, 217 can be compressively strained, since the silicon germanide adapts to the silicon in the substrate 201. The value of the strain in the strain-creating elements 216, 217 depends on the ratio between the concentration of germanium and the concentration of silicon. Portions of the strain-creating elements 216, 217 having a moderately high ratio between the concentration of germanium and the concentration of silicon can be subject to a greater compressive strain than portions of the strain-creating elements 216, 217 having a relatively low ratio between the concentration of germanium and the concentration of silicon.

Silicon carbide has a lattice constant which is smaller than the lattice constant of silicon. The silicon carbide in the strain-creating elements 216, 217, however, may adapt to the crystal lattice of the silicon in the substrate 201 such that the strain-creating elements 216, 217 are subject to tensile strain. The tensile strain may influence the strain state of portions of the substrate 201 in the vicinity of the strain-creating elements. Thus, a tensile strain may be created in a channel region 240 below the gate electrode 206.

The strength of the strain in the strain-creating elements 216, 217 when comprising silicon carbide may be influenced by a ratio between the concentration of carbon and the concentration of silicon. Portions of the strain-creating elements 216, 217 having a moderately high ratio between the concentration of carbon and the concentration of silicon may be subject to a greater tensile strain than portions of the strain-creating elements 216, 217 having a moderately low ratio between the concentration of carbon and the concentration of silicon.

In general, the strain state of a portion of one of the strain-creating elements 216, 217 can be influenced by a ratio between the concentration of the first chemical element and the concentration of the second chemical element in the portion of the strain-creating elements 216, 217.

The strain in the strain-creating elements 216, 217 may act on portions of the substrate 201 in the vicinity of the strain-creating elements 216, 217, in particular on portions of the substrate 201 below the gate electrode 206 wherein a channel region 240 of the field effect transistor element 230 is formed. Thus, the mobility of holes and/or electrons in the channel region 240 can be increased.

Each of the strain-creating elements 216, 217 comprises a first portion and a second portion, wherein a first concentration ratio between a concentration of the first chemical element in the first portion and a concentration of the second chemical element in the first portion is different from a second concentration ratio between a concentration of the first chemical element in the second portion and a concentration of the second chemical element in the second portion. In some embodiments, the first concentration ratio can be smaller than the second concentration ratio.

Each of the first portion and the second portion of the strain-creating element 216 can be provided in the form of one of a plurality of sub-layers 216a, 216b, 216c, 216d of the strain-creating element 216, wherein the second portion is located above the first portion. For example, the first portion of the strain-creating element 216 can be provided in the form of the sub-layer 216a being located at the interface 250 between the semiconductor substrate 201 and the strain-creating element and the second portion can be provided in the form of one of the sub-layers 216b, 216c, 216d, for example in the form of the sub-layer 216d located at the surface of the strain-creating element 217. In other embodiments, the first portion and the second portion can be provided in other arrangements of the sub-layers 216a, 216b, 216c, 216d, as long as the sub-layer corresponding to the second portion is located above the sub-layer corresponding to the first portion.

Similarly, the first portion and the second portion of the strain-creating element 217 can each be provided in the form of one of a plurality of sub-layers 217a, 217b, 217c, 217d of the second strain-creating element 217, wherein the sub-layer corresponding to the second portion is located above the sub-layer corresponding to the first portion. Reference numeral 251 denotes an interface between the semiconductor substrate 201 and the strain-creating element 217.

Figure 3A:
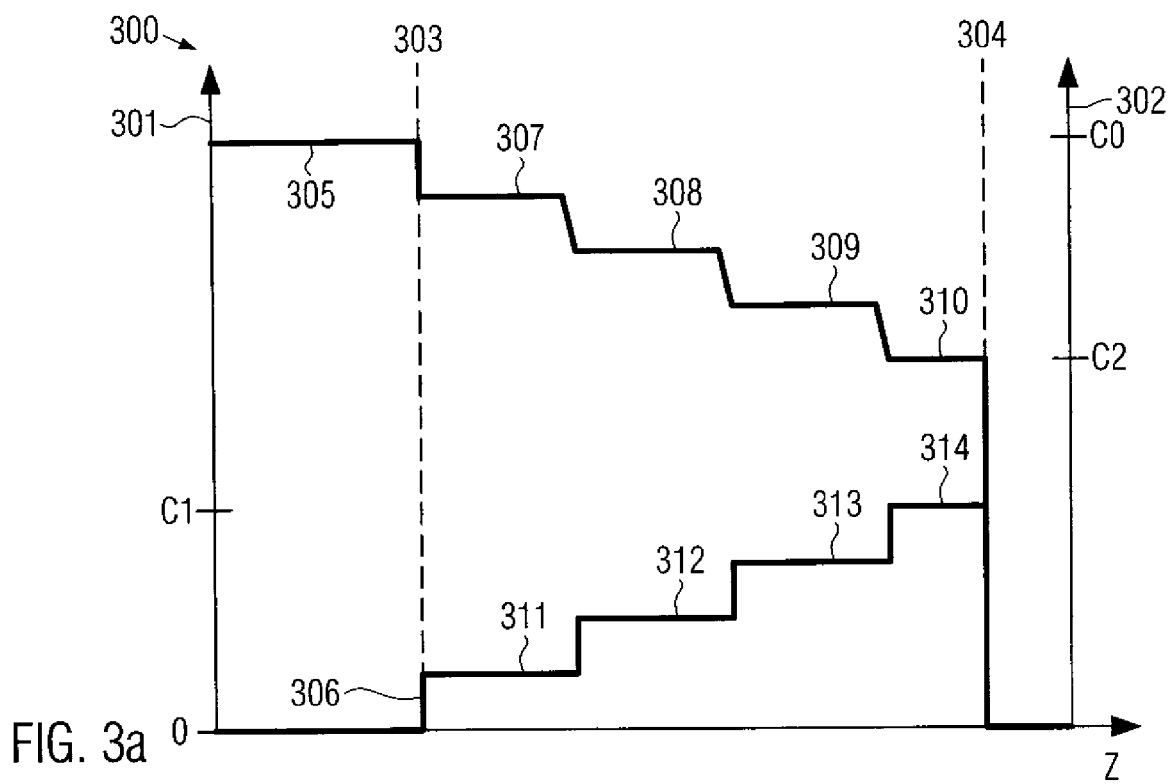
FIGS. 3a-3b show schematic diagrams illustrating concentrations of chemical elements in a semiconductor structure formed by the manufacturing process illustrated in FIGS. 2a-2b and reactant flows in the manufacturing process.

FIG. 3a shows a schematic diagram 300 of the concentrations of the first chemical element and the second chemical element along a line Z vertically running through the semiconductor substrate 201 and the first strain-creating element 216, wherein the vertical direction is a direction substantially perpendicular to a surface of the substrate 201 and/or the interface between the substrate 201 and the strain-creating element 216. A first coordinate axis 301 denotes values of the concentration of the first chemical element along the line Z and a second coordinate axis 302 denotes values of the concentration of the second chemical element along the line Z. The concentration of the first chemical element is represented by a curve 306 and the concentration of the second chemical element is represented by a curve 305. A first vertical line 303 denotes the location of the interface between the substrate 201 and the first strain-creating element 216 and a second vertical line 304 denotes the location of the surface of the first strain-creating element 216.

In the substrate 201, the concentration of the second chemical element assumes a relatively high value C0 whereas the concentration of the first chemical element can be approximately zero. The first sub-layer 216a comprises the first chemical element in a concentration greater than zero. Correspondingly, the concentration of the second chemical element in the first sub-layer 216a is smaller than the concentration of the second chemical element in the substrate 201. The other sub-layers 216b, 216c, 216d may comprise the first chemical element and the second chemical element in concentrations which differ from those in the first sub-layer 216a. In particular, the concentration of the first chemical element in the second sub-layer 216b may be higher than the concentration of the first chemical element in the first sub-layer 216a. The third sub-layer 216c and the fourth sub-layer 216d may comprise the first chemical element in even higher concentrations. Correspondingly, the concentration of the second chemical element in the sub-layers 216b, 216c, 216d may become smaller.

The concentration of the first chemical element and the second chemical element in the individual sub-layers 216a, 216b, 216c, 216d may be approximately constant throughout the respective sub-layers. Therefore, the curve 305 corresponding to the concentration of the second chemical element may decrease in a series of steps 307, 308, 309, 310 which correspond to the sub-layers 216a, 216b, 216c, 216d to a concentration C2 of the second chemical element at the surface of the strain-creating element 216. Correspondingly, the curve 306 which corresponds to the concentration of the first chemical element may increase in a series of steps 311, 312, 313, 314 to a concentration C1 of the first chemical element at the surface of the first strain-creating element 216.

The ratio between the concentration of the first chemical element and the concentration of the second chemical element in the second portion of the strain-creating element can be greater than about 1%. In some embodiments, the ratio can be even greater than about 10%. In particular, a ratio C1/C2 between the concentrations C1 and C2 can be greater than 1% or greater than 10%, respectively.

The composition of the sub-layers 217a, 217b, 217c, 217d of the second strain-creating element 217 may be substantially identical to that of the sub-layers 216a, 216b, 216c, 216d of the first strain-creating element 216.

Since, as detailed above, the strain state of the first and second portions of the strain-creating elements 216, 217 may depend on the ratio between the concentration of the first chemical element and the concentration of the second chemical element in the respective portion, high gradients of the strain, which can lead to an undesirable formation of dislocations, may be advantageously avoided by adapting the concentrations of the first chemical element and the second chemical element in the first and second portions of the strain-creating elements 216, 217.

The first strain-creating element 216 and the second strain-creating element 217 may be formed by means of a selective epitaxial growth process. Selective epitaxial growth is a variant of plasma enhanced chemical vapor deposition well known to persons skilled in the art, wherein process parameters such as temperature, pressure and composition of the reactant gas are adapted such that a layer of material is deposited only on the exposed portions of the substrate 201, in particular in the cavities 210, 211, whereas there is substantially no deposition on the trench isolation structure 202, the cap layer 207 and the first sidewall spacers 208, 209.

The concentration of the first chemical element and the second chemical element in the strain-creating elements 216, 217 can be controlled by varying flow rates of a first reactant comprising the first chemical element and a second reactant comprising the second chemical element. In general, a greater ratio between the flow rate of the first reactant and the flow rate of the second reactant entails a greater concentration of the first chemical element in the deposited material.

In embodiments wherein the substrate 201 comprises silicon and the cap layer 207 and the first sidewall spacers 208, 209 comprise silicon dioxide and/or silicon nitride, the first reactant may comprise germane ($GeH_4$) and the second reactant may comprise dichlorosilane ($SiH_2Cl_2$). These reactants can be supplied in gaseous form to form strain-creating elements 216, 217 comprising silicon germanide. Additionally, hydrogen may be provided as a carrier gas and hydrochloric acid (HCl) may be supplied in order to increase the selectivity of the epitaxial growth of silicon germanide.

In other embodiments wherein the strain-creating elements 216, 217 comprise silicon carbide, the first reactant may comprise ethene ($C_2H_4$) and the second reactant may comprise silane ($SiH_4$). Additionally, hydrochloric acid (HCl) may be provided in order to increase the selectivity of the growth process.

A ratio between the flow rate of the first reactant and the flow rate of the second reactant can be changed during the selective epitaxial growth process.

Figure 3B:
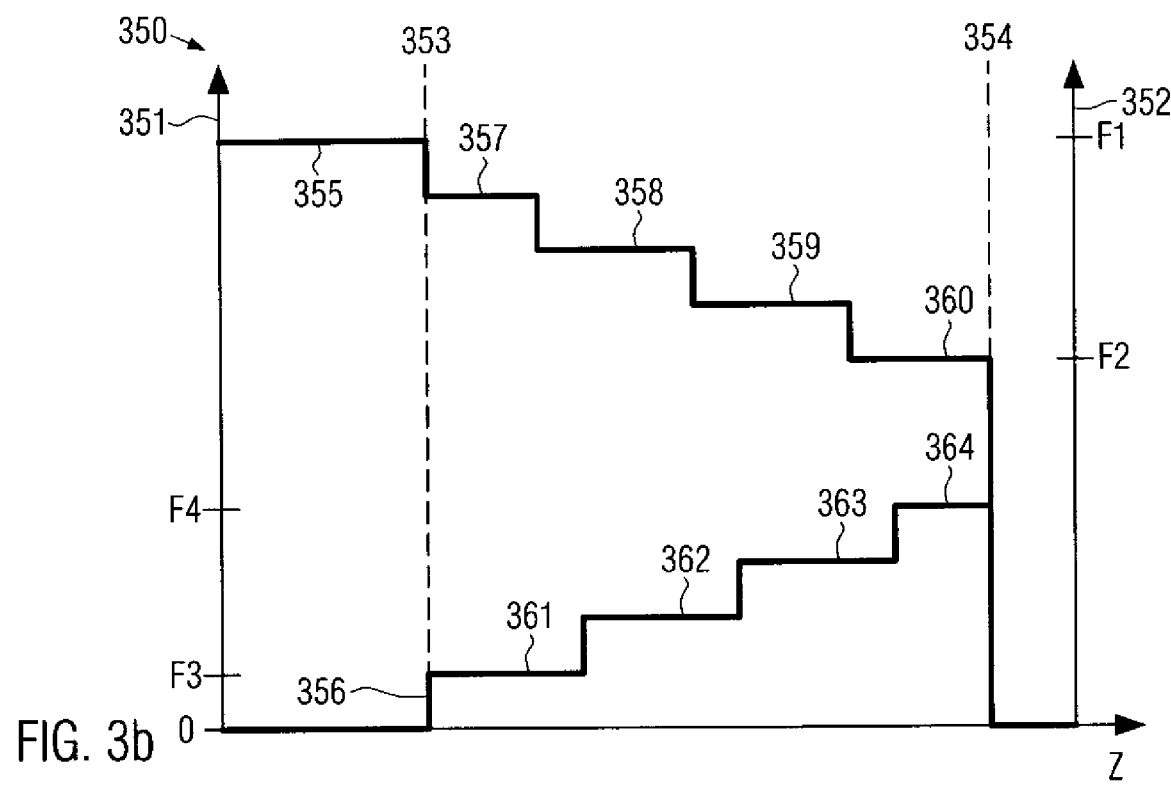

FIG. 3b shows a schematic diagram 300 of dependence of the flow rates of the first reactant and the second reactant on time t. A first coordinate axis 351 represents values of the flow of the first reactant which is indicated by a first curve 356. A second coordinate axis 352 represents values of the flow of the second reactant which is indicated by a second curve 355. A first vertical line 353 indicates the point in time where the selective epitaxial growth process is started and a second vertical line 354 indicates the point in time at which the selective epitaxial growth process is stopped after the completion of the formation of the strain-creating elements 216, 217.

At the beginning of the selective epitaxial growth process, a moderately large flow of the second reactant and a relatively small flow of the first reactant are supplied to form the first sub-layers 216a, 217a of the strain-creating elements 216, 217. After the formation of the first sub-layers 216a, 217a, at least one of the flow rate of the first reactant and the flow rate of the second reactant can be varied in order to change the ratio between the flow rate of the first reactant and the flow rate of the second reactant. Thereafter, the second sub-layers 216b, 217b of the strain-creating elements 216, 217 can be formed. Subsequently, the ratio between the flow rate of the first reactant and the flow rate of the second reactant can be changed to form the third sub-layers 216c, 217c. After the formation of the third sub-layers 216c, 217c, the ratio between the flow rates can be changed once again to form the fourth sub-layers 216d, 217d.

The change of the flow rate of the first reactant is indicated in FIG. 3b by steps 361, 362, 363, 364 of the curve 356. Each of these steps corresponds to the formation of a respective pair of the sub-layers 216a, 217a, 216b, 217b, 216c, 217c, 216d, 217d of the strain-creating elements 216, 217. Similarly, the curve 355 comprises steps 357, 358, 359, 360 corresponding to the change of the flow rate of the second reactant. In the course of the selective epitaxial growth process, the flow rate of the first reactant can be increased from a first flow rate F3 to a second flow rate F4, while the flow rate of the second reactant is reduced from a first flow rate F1 to a second flow rate F2.

Figure 2B:
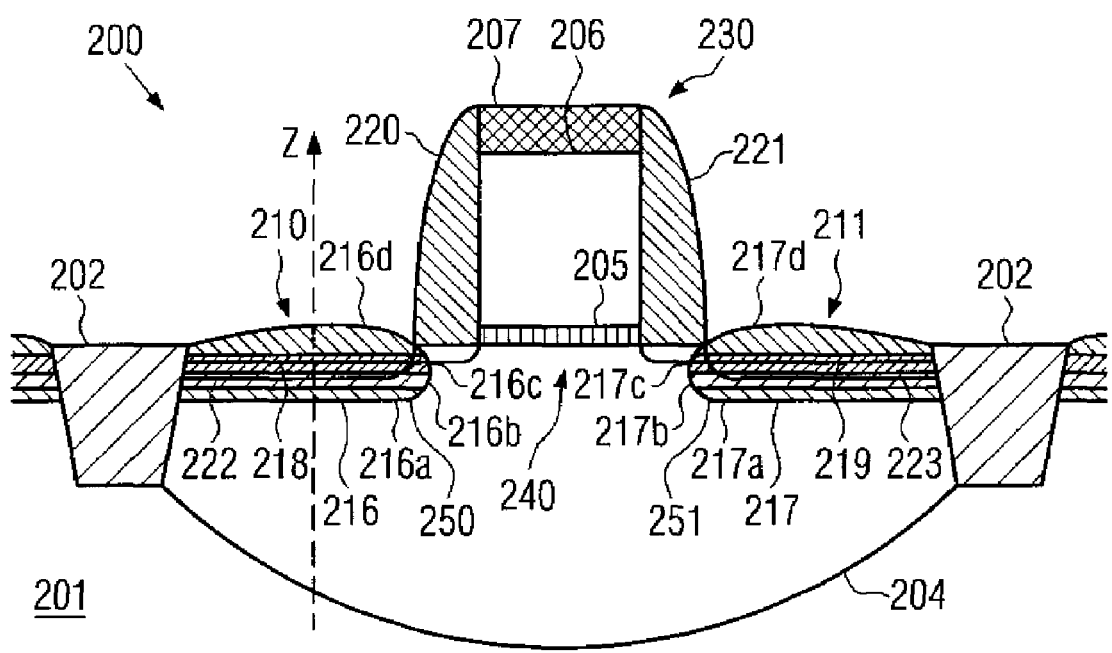

FIG. 2b shows a schematic cross-sectional view of the semiconductor structure 200 in yet another stage of the manufacturing process. After the formation of the strain-creating elements 216, 217, the first sidewall spacers 208, 209 and, optionally, the cap layer 207 can be removed. This can be done by means of a known etch process adapted to selectively remove the material of the first sidewall spacers 208, 209 and/or the cap layer 207, leaving the materials of the gate electrode 206, the strain-creating elements 216, 217 and the trench isolation structure 202 substantially intact.

Then, a first ion implantation process wherein ions of a dopant material are introduced into portions of the substrate 201 and/or the strain-creating elements 216, 217 is performed to form an extended source region 218 and an extended drain region 219.

Subsequently, second sidewall spacers 220, 221 can be formed adjacent the gate electrode 206 by means of known methods comprising deposition of a layer of spacer material and an anisotropic etch process, and a source region 222 and a drain region 223 may be formed adjacent the second sidewall spacers 220, 221 by means of a second ion implantation process. Finally, an annealing process can be performed in order to activate the dopants introduced into the extended source region 218, the extended drain region 219, the source region 222 and the drain region 223.

The present invention is not restricted to embodiments wherein the first sidewall spacers 208, 209 are removed after the formation of the strain-creating elements 216, 217. In other embodiments, an extended source region similar to the extended source region 218 and an extended drain region similar to the extended drain region 219 can be formed after the formation of the gate electrode 206 and before the formation of the first sidewall spacers 208, 209. During the processes performed in the formation of the cavities 210, 211 and the strain-creating elements 216, 217, the first sidewall spacers 208, 209 protect portions of the extended source region and the extended drain region below the first sidewall spacers 208, 209. Hence, these portions remain in the semiconductor structure 200.

In such embodiments, the material deposited in the formation of the strain-creating elements 216, 217 can be doped while the strain-creating elements are formed. To this end, a chemical compound comprising the dopant material can be added to the gas supplied in the selective epitaxial growth process. In the selective epitaxial growth process, the dopant material is incorporated into the material of the strain-creating elements 216, 217 and doped strain-creating elements 216, 217 are formed. The doped strain-creating elements, together with the portions of the extended source region and the extended drain region under the first sidewall spacers 220, 221, form a source and a drain.

In other embodiments wherein an extended source region and an extended drain region are formed prior to the formation of the strain-creating elements 216, 217, source and drain regions similar to the source region 222 and the drain region 223 can be formed by performing an ion implantation in order to introduce ions of a dopant material into the strain-creating elements 216, 217. The first sidewall spacers 208, 209 may remain on the surface of the substrate 201 during this ion implantation. Thus, the source region and the drain region are spaced apart from the gate electrode 206.

In a field effect transistor as disclosed herein, the first portions and the second portions of the strain-creating elements 216, 217 need not be provided in the form of sub-layers of the strain-creating elements 216, 217 wherein the concentrations of the first chemical element and the second chemical element are substantially constant in the interior of each of the sub-layers 216a-216d, 217a-217d as shown in FIG. 3a. In other embodiments, a smooth transition wherein the concentrations of the first chemical element and the second chemical element vary continuously may be provided between at least two of the sub-layers 216a-216d, 217a-217d. In particular, a continuous transition may be provided at each interface between adjacent ones of the sub-layers 216a-216d, 217a-217d. Advantageously, such embodiments may allow a further reduction of strain gradients in the strain-creating elements 216, 217 and/or in the vicinity thereof.

In still further embodiments, a ratio between the concentration of the first chemical element and the concentration of the second chemical element in a strain-creating element may increase continuously in the vertical direction with increasing distance from a substrate.

In such embodiments, which will be described in the following with reference to FIGS. 4, 5a and 5b, a first portion of a strain-creating element and a second portion of a strain-creating element can be provided in the form of arbitrary sections of the strain-creating element whose centers of gravity are provided at a different distance from the substrate. Concentrations of the first chemical element and the second chemical element in the first and the second portion of the strain-creating element may be determined in the form of averaged values of local concentrations of the first and the second chemical element, wherein the averaging is performed as a spatial average over the respective portion of the strain-creating element.

Figure 4:
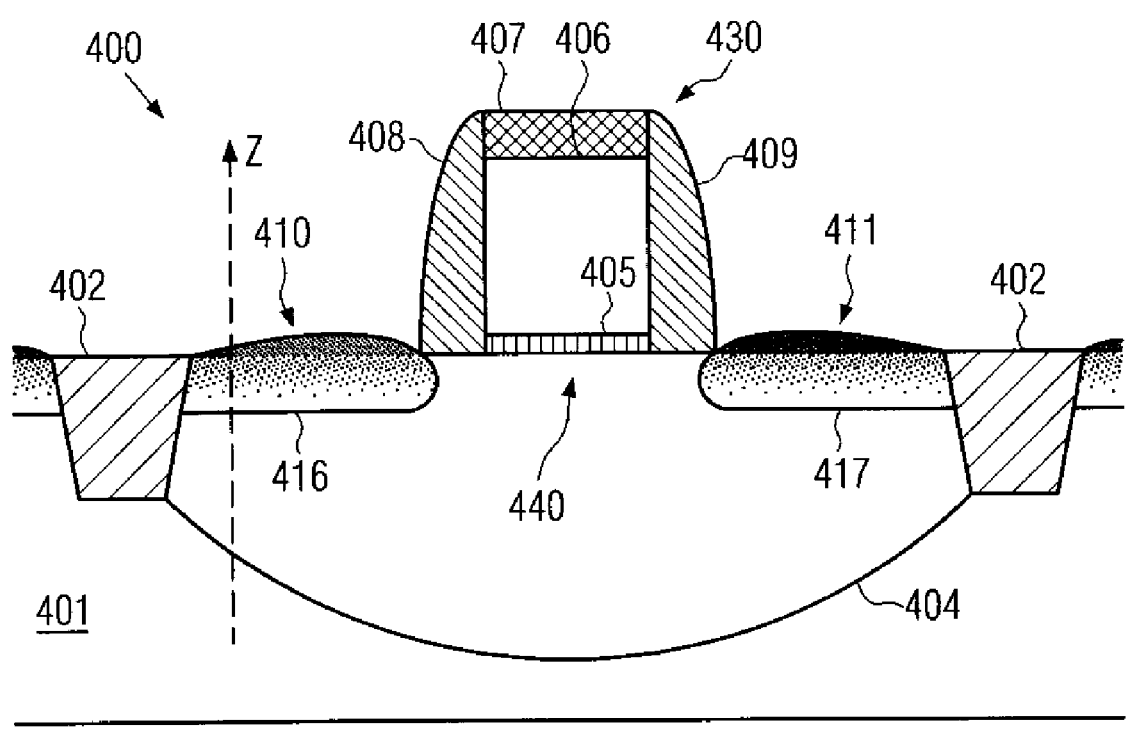
FIG. 4 shows a schematic cross-sectional view of a semiconductor structure in a stage of a manufacturing process according to another embodiment disclosed herein.
Figure 5A:
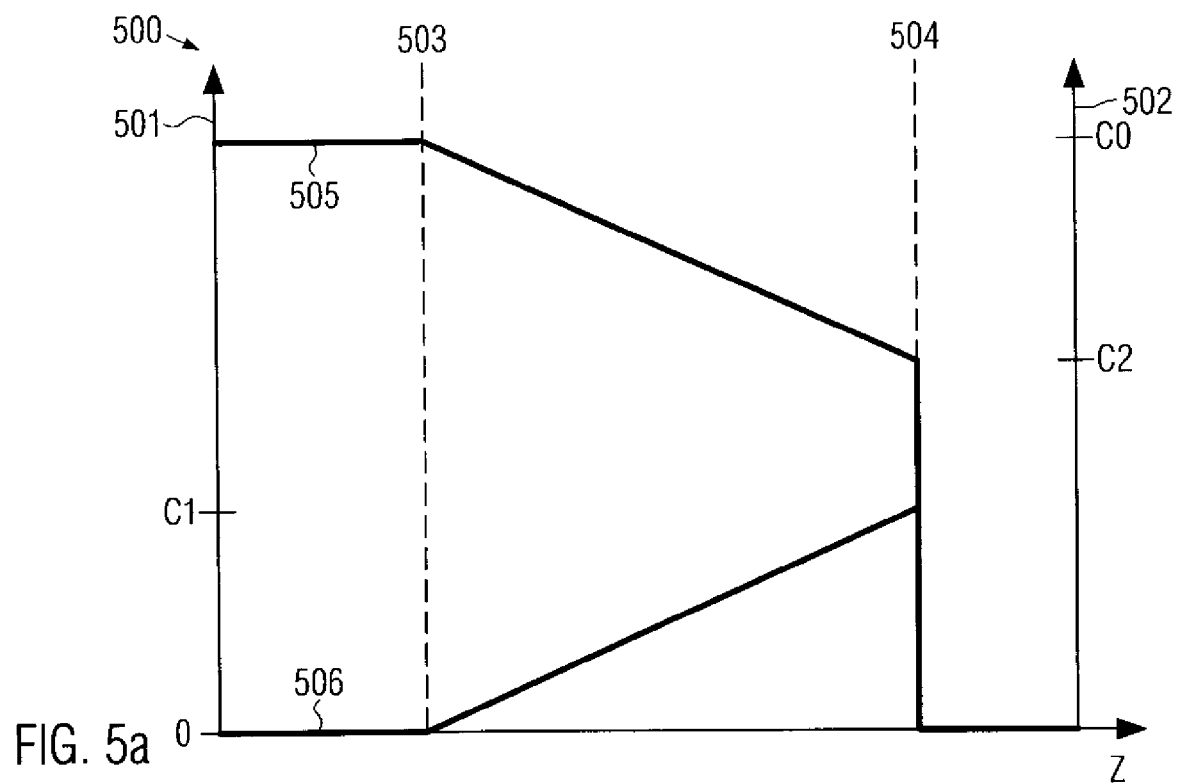
FIGS. 5a-5b show schematic diagrams illustrating concentrations of chemical elements in a semiconductor structure formed by the manufacturing process illustrated in FIG. 4 and reactant flows in the manufacturing process.

FIG. 4 shows a schematic cross-sectional view of a semiconductor structure 400 in a stage of a manufacturing process according to the present disclosure. The semiconductor structure 400 comprises a substrate 401 and a field effect transistor element 430 formed in and on the substrate 401. The field effect transistor element 430 comprises an active region 404 and a trench isolation structure 402 which insulates the active region 404 electrically from other circuit elements (not shown) in the semiconductor structure 400. A gate electrode 406 which is separated from the active region 404 by a gate insulation layer 405 is formed over the active region 404. The gate electrode 406 is flanked by first sidewall spacers 408, 409 and may be covered by a cap layer 407. Adjacent the gate electrode 406, a source side cavity 410 and a drain side cavity 411 are formed.

The formation of these features may be performed by means of methods similar to those employed in the formation of the semiconductor structure 200 described above with reference to FIGS. 2a, 2b, 3a and 3b.

A first strain-creating element 416 is formed in the source side cavity 410 and a second strain-creating element 417 is formed in the drain side cavity 411. Similar to the embodiments described above with reference to FIGS. 2a, 2b, 3a and 3b, the strain-creating elements 416, 417 comprise a compound material comprising a first chemical element and a second chemical element.

A ratio between the concentration of the first chemical element and the concentration of the second chemical element increases in a vertical direction perpendicular to a surface of the substrate 401 and/or a surface of the strain-creating elements 416, 417, as indicated schematically by the shading of the strain-creating elements 416, 417. In FIG. 4, the vertical direction is indicated by a dashed line Z. Thus, in portions of the strain-creating elements 416, 417 in the vicinity of interfaces between the substrate 401 and the strain-creating elements 416, 417, the ratio between the concentration of the first chemical element and the concentration of the second chemical element assumes lower values than in portions of the strain-creating elements 416, 417 in the vicinity of the surfaces of the strain-creating elements 416, 417.

The ratio between the concentration of the first chemical element and the concentration of the second chemical element may increase substantially continuously in the vertical direction Z with increasing distance from the substrate 401. FIG. 5a shows a schematic drawing 500 of the concentrations of the first and the second chemical element in the semiconductor structure 400 along the vertical line Z (FIG. 4). A first vertical coordinate axis 501 represent values of the concentration of the first chemical element and a second vertical coordinate axis 502 represents values of the concentration of the second chemical element. A first dashed vertical line 503 indicates a location of an interface between the substrate 401 and the first strain-creating element 416. A second dashed vertical line 504 indicates a location of the surface of the first strain-creating element 416. A first curve 506 shows the concentration of the first chemical element and a second curve 505 shows a concentration of the second chemical element.

Inside the substrate 401, which may, apart from dopants introduced in the formation of the active region 404, substantially comprise the second chemical element (which may, for example, be silicon), the concentration of the second chemical element may assume a relatively large value C0. The concentration of the first chemical element (which may, for example, comprise germanium or carbon) in the substrate 401 can be approximately zero. In the strain-creating element 416, the concentration of the first chemical element may increase linearly to a value C1 at the surface of the strain-creating element 416. Correspondingly, the concentration of the second chemical element may drop to a concentration C2 at the surface of the first strain-creating element 416.

The increase of the concentration of the first chemical element with increasing distance from the substrate 401 need not be linear. In other embodiments, the concentration of the first chemical element may increase in a non-linear fashion. For example, there may be a relatively large increase of the concentration of the first chemical element in the vicinity of the interface between the substrate 401 and the first strain-creating element 416, followed by a slower increase of the concentration of the first chemical element in the vicinity of the surface of the first strain-creating element 416.

The ratio between the concentration of the first chemical element and the concentration of the second chemical element may be greater than about 1% in at least one portion of the strain-creating elements 416, 417, for example in the vicinity of the surface of the strain-creating elements 416 417. In some embodiments, the strain-creating elements 416, 417 may even comprise portions wherein the ratio between the concentration of the first chemical element and the concentration of the second chemical element is greater than about 10%.

The concentrations of the first chemical element and the concentration of the second chemical element in the second strain-creating element 417 may be substantially identical to those in the first strain-creating element 416.

Similar to the embodiments described above with reference to FIGS. 2a, 2b, 3a and 3b, the strain-creating elements 416, 417 can be formed by means of a selective epitaxial growth process wherein a first reactant comprising the first chemical element and a second reactant comprising a second chemical element are supplied, optionally, in addition to further chemical compounds provided in order to increase the selectivity of the growth process and/or carrier gases. A ratio between a flow rate of the first reactant and a flow rate of the second reactant can be varied in order to deposit the material of the strain-creating elements 416, 417 with a varying ratio between the concentration of the first chemical element and the concentration of the second chemical element.

Figure 5B:
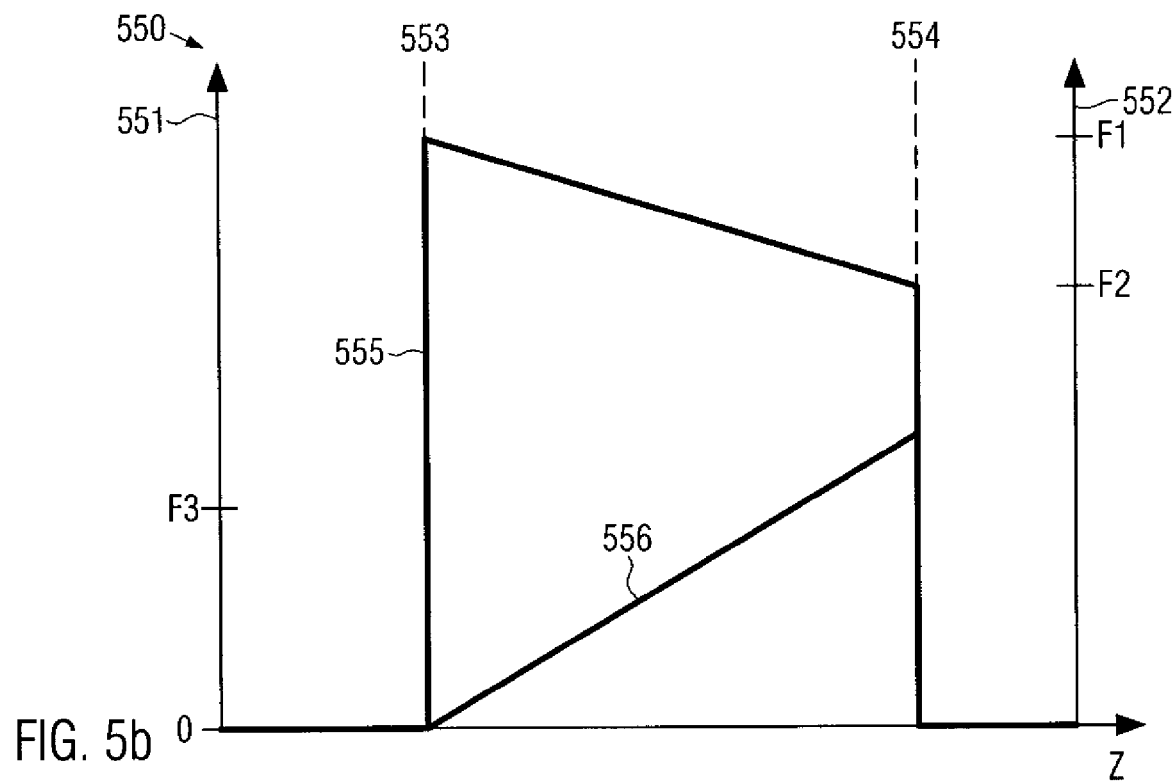

FIG. 5b shows a schematic diagram 550 of the dependence of the flow rates of the first and the second chemical element on time t. A first coordinate axis 551 represents values of the flow rate of the first chemical element. A second coordinate axis 552 represents values of the flow rate of the second chemical element. A first vertical dashed line 553 indicates the point in time where the selective epitaxial growth process is started and a second vertical dashed line 554 indicates the point in time where the selective epitaxial growth process is stopped after the completion of the strain-creating elements 416, 417. A first curve 556 shows the flow rate of the first chemical element. The flow rate of the second chemical element is shown by a second curve 555.

Before the start of the selective epitaxial growth process, the flow rates of both chemical elements may be approximately zero. At the start of the selective epitaxial growth process, a relatively large flow rate F1 of the second reactant may be provided while the flow rate of the first chemical element may be substantially zero. Thus, at the beginning of the selective epitaxial growth process, the second chemical element may be deposited in substantially pure form.

In embodiments wherein the semiconductor substrate 401 comprises the second chemical element, a deposition of the second chemical element in substantially pure form at the beginning of the selective epitaxial growth process may help reduce the roughness of the surface of the substrate 401 in the cavities 410, 411. In particular, reduction in the roughness may occur if the deposition process has a relatively low degree of anisotropy or is substantially isotropic. The roughness reduction effect of the deposition of the second chemical element in substantially pure form may be particularly advantageously used in embodiments wherein no roughness reduction process is performed after the formation of the cavities 410, 411.

During the selective epitaxial growth process, the flow rate of the first reactant may be substantially continuously increased until a relatively large flow rate F3 is obtained at the end of the selective epitaxial growth process. The flow rate of the second reactant may be reduced concurrently with the increase of the flow rate of the first reactant until a flow rate F2 smaller than the flow rate F1 is obtained at the end of the selective epitaxial growth process. Thus, the ratio between the flow rate of the first reactant and the flow rate of the second reactant increases continuously during the selective epitaxial growth process.

Therefore, in the course of the selective epitaxial growth process, material may be deposited, wherein the ratio between the concentration of the first chemical element and the concentration of the second chemical element increases in material deposited at later points of time. Thus, in the strain-creating element 416, 417, the ratio between the concentration of the first chemical element and the concentration of the second chemical element may increase with increasing distance from the semiconductor substrate 401.

After the formation of the strain-creating elements 416, 417, the first sidewall spacers 408, 409 and, optionally, the cap layer 407 may be removed, and extended source and drain regions can be formed in the substrate 401 and the strain-creating elements 416, 417 adjacent the gate electrode 406. Then, second sidewall spacers (not shown) may be formed at the flanks of the gate electrode 406 and source and drain regions can be formed in the strain-creating elements 416, 417. The formation of the second sidewall spacers, the extended source and drain regions and the source and drain regions may be performed similar to the formation of the extended source and drain regions 218, 219, the second sidewall spacers 220, 221 and the source and drain regions 222, 223 in the embodiments described above with reference to FIGS. 2a, 2b, 3a and 3b.

Similar to the embodiments described above with reference to FIGS. 2a, 2b, 3a and 3b, other methods may be employed to form extended source and drain regions and source and drain regions adjacent the gate electrode 206.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a field effect transistor, comprising:
    providing a semiconductor substrate, a gate electrode being formed above said semiconductor substrate;
    forming at least one cavity in said substrate adjacent said gate electrode; and
    forming a strain-creating element in said at least one cavity, said strain-creating element comprising:
        a compound material comprising a first chemical element and a second chemical element, wherein said first chemical element comprises one of germanium and carbon, said second chemical element comprises silicon, and said semiconductor substrate comprises said second chemical element;
    a first portion and a second portion, wherein said second portion is located above said first portion;
    a first concentration ratio between a concentration of said first chemical element in said first portion and a concentration of said second chemical element in said first portion; and
    a second concentration ratio between a concentration of said first chemical element in said second portion and a concentration of said second chemical element in said second portion, wherein said first concentration ratio is smaller than said second concentration ratio and wherein a ratio between a concentration of said first chemical element and a concentration of said second chemical element increases in a vertical direction with increasing distance from a bottom surface of said at least one cavity formed in said substrate.

2. The method of claim 1, wherein said first portion of said strain-creating element and said second portion of said strain-creating element comprise sub-layers of said strain-creating element.

3. The method of claim 2, wherein said second concentration ratio is greater than about 1%.

4. The method of claim 3, wherein said second concentration ratio is greater than about 10%.

5. The method of claim 1, wherein said formation of said strain-creating element comprises performing a selective epitaxial growth process.

6. The method of claim 5, further comprising changing a ratio between a flow rate of a first reactant comprising said first chemical element and a flow rate of a second reactant comprising said second chemical element during said selective epitaxial growth process, wherein said ratio between said flow rates is increased substantially continuously during said selective epitaxial growth process.

7. A method of forming a field effect transistor, comprising:
    providing a semiconductor substrate, a gate electrode being formed above said substrate;
    forming at least one cavity in said substrate adjacent said gate electrode; and
    performing a selective epitaxial growth process adapted to form a strain-creating element in said cavity, said strain-creating element comprising a compound material comprising a first chemical element and a second chemical element, said first chemical element comprising one of germanium and carbon, said second chemical element comprising silicon, and said semiconductor substrate comprising said second chemical element, wherein said selective epitaxial growth process comprises:

supplying a first reactant comprising said first chemical element and a second reactant comprising said second chemical element; and increasing a ratio between a flow rate of said first reactant and a flow rate of said second reactant at least once during said selective epitaxial growth process, wherein said ratio between said flow rates is increased substantially continuously during said selective epitaxial growth process.

* * * * *